(12) United States Patent
Abboud et al.

(10) Patent No.: US 6,433,348 B1
(45) Date of Patent: Aug. 13, 2002

(54) LITHOGRAPHY USING MULTIPLE PASS RASTER-SHAPED BEAM

(75) Inventors: Fayez E. Abboud, Pleasanton; Jan M. Chabala, San Ramon, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/625,132

(22) Filed: Jul. 25, 2000

(51) Int. Cl.⁷ .............................................. H01J 37/302
(52) U.S. Cl. .............................. 250/492.22; 250/492.23
(58) Field of Search ......................... 250/492.22, 492.23

(56) References Cited

U.S. PATENT DOCUMENTS 4,213,053 A * 7/1980 Pfeiffer ..................... 250/492 A
5,703,376 A * 12/1997 Jensen ..................... 250/492.22
6,166,387 A * 12/2000 Muraki et al. ........... 250/492.2

* cited by examiner

Primary Examiner—Kiet T. Nguyen
(74) Attorney, Agent, or Firm—Jung-hua Kuo

(57) ABSTRACT

A scanning lithography tool exposes a medium in a raster scan. The raster scan is a multi-pass scan in which the shape of the beam, while fixed for any one pass, is altered between passes. Thus, certain pixels are exposed in one or more scans using a Gaussian (round) beam while other pixels are exposed in separate scans using, for instance, a shaped (e.g., square or rectangular) shaped beam. Beam shape here refers to the cross-sectional shape of the beam as incident on the medium. This process, especially when the shaped beam is applied at the corners and slanted edges of a feature being exposed, has been found to substantially reduce the problem of edge blur otherwise typical of raster scan lithography. This process is applicable to both electron beam and laser beam raster scanning lithography.

25 Claims, 3 Drawing Sheets

LITHOGRAPHY USING MULTIPLE PASS RASTER-SHAPED BEAM

FIELD OF THE INVENTION

This invention relates to lithography and more specifically to scanning beam lithography using beams that have a shaped cross section.

DESCRIPTION OF RELATED ART

The field of lithography is well known, especially for use in the semiconductor industry. Typical is semiconductor fabrication by electron beam lithography or laser beam lithography where the electron beam or laser beam is scanned across a sensitive layer. This process is used to fabricate masks or to direct write semiconductor wafers. Lithography systems generate or expose patterns on a substrate which is typically the semiconductor wafer or mask blank by controlling the flow of energy (the beam) from a source to the substrate coated with a resist layer sensitive to that form of energy. Pattern exposure is controlled and broken into discrete units commonly referred to as flashes, wherein a flash is that portion of the pattern exposed during one cycle of an exposure sequence. Flashes are produced by allowing energy from the source, for example, light, electron, or other particle beams to reach the coated substrate within selected pattern areas. The details of flash composition, dose, and exposure sequence used to produce a pattern, and hence the control of the lithographic system, make up what is known as a writing strategy.

A traditional raster scan writing strategy employs a uniform periodic raster scan, somewhat similar to television raster scanning. A mechanical stage moves a substrate, for example, placed on a table, uniformly in a direction orthogonal to the direction of the uniform scan of the energy beam. In this manner, a pattern is composed on a regular grid with a regular scan trajectory resulting from the orthogonal movement of the stage and beam. When the beam is positioned over a grid site requiring exposure, the beam is unblanked and the underlying site exposed. In some embodiments, the amount of dose, or energy, at each site is varied as required. Hence, exposure data can be organized in a time order related to the regular scanned trajectory, and only the dose for each site need be specified. The distinguishing characteristics of a traditional raster scan writing strategy are a small round (Gaussian) beam, exposing sites one at a time, a periodic scan moving sequentially to each site of the grid, and a rasterized representation of data corresponding to the required dose for each site or "pixel" of the grid. By Gaussian is meant a beam that is most intense at the center and whose intensity falls off (to good approximation) in accordance with a Gaussian curve towards its perimeter.

Also known in the lithography field is vector scan writing wherein the beam is positioned only over those sites that require exposure and then unblanked to expose the site. Positioning is accomplished by a combination of the stage and beam movement in what is referred to as a semi-random scan. Pattern data must be provided that includes bout the dose and position of each flash or site exposed.

Frequently vector scan strategies use a variable shaped beam, that is a beam capable of having different size and/or shape, in terms of its cross section, for each flash. The pattern is then composed from these variable shapes. For an example of variable shaped beam see Rishton et al., "Raster Shaped Beam Electron Beam Exposure Strategy Using a Two-Dimensional Multi Pixel Flash Field", U.S. patent application Ser. No. 09/226,361, filed Jan. 6, 1999, and commonly owed with the present disclosure, the disclosure of which is incorporated herein by reference in its entirety. The shaped beam in that disclosure is accomplished by associated circuitry and software including shape codes which specify rectangular shaped exposed areas with four different rotations. Various shape codes specify exposed areas that can be either square or rectangular shaped with four different rotations. Other codes represent L-shaped exposed areas with four different rotations. In other embodiments, shape coudes can represent other shapes of the beam. By shape is meant the cross section of the beam where it is incident on the substrate being exposed.

Such a system includes typically a shaper/blanker driver that includes a translator, output device, timer, and can include a retrograde scan device. The shaper/blanker driver request and receives flash data, i.e., shape data and corresponding dose values from respective flash converter and dose value circuitry. A translator receives the flash data and converts the shape data in corresponding dose values into respective voltage values and an exposure time. The translator provides exposure time to a timer and provides both values to an output device.

Additionally, in one embodiment for each input shape data there is an entry in a shape lookup table in a memory and which outputs four voltage values, to various multiplexers. The voltage values specify a two-dimensional electric field deflection by an upper deflector (this is in the context of an electron beam) that effectively control a shaping of the electron beam cross section by controlling a location that the electron beam intersects a lower aperture. Two voltage values specify a two-dimensional electric field deflection by a lower deflector that effectively offsets any deflection by the upper deflector and positions the shaped electron beam on an intended portion of the target substrate. The location at which the electron beam intersects the lower aperture is adjustable by a large number of incremental distance units in either the horizontal or vertically directions within the plane of the lower aperture. This fine incremental positioning allows for offsetting fine errors due, for example, to variations in an opening defined by the lower aperture over time (aperture erosion).

Furthermore, in one embodiment a retrograde scan device adjusts the voltages provided to the lower deflector to offset the movement of the position of the beam on the substrate during the raster scan. The retrograde scan prevents the electron beam column from spreading a flash field beyond its intended area. Further details are in the above-referenced disclosure. Of course, that disclosure is not limiting as to shaped beams. Shaping of laser beams cannot be done using deflectors but instead is accomplished using various aperture arrangements and optics components. As examples, laser beams can be shaped by mechanically changing the shape of an aperture, or by deflecting the laser beam across an aperture (in analogy to the procedure described for electron beams).

Also well known in the electron beam lithography area is raster gray beam writing used in lithography tools known commercially as MEBES®((manufacturing electron beam exposure system) available from Etec Systems, Inc. See also U.S. Pat. No. 3,900,737 to Collier et al. Examples are the Etec MEBES® 4500, 5000 and 5500 electron beam lithography systems. For an example of a similar type raster scan electron beam system see Abboud et al. U.S. Pat. No. 5,393,987 issued Feb. 28, 1995, assigned to Etec Systems, Inc. and incorporated herein by reference in its entirety.

Raster gray beam writing refers to use of beams which have graduations of dose intensity on a pixel-by-pixel basis.

In addition, gray beam writing can also be achieved by scanning the substrate several times. The flash data can vary from one scan to the next, in order to create the desired gradient on the substrate. This provides benefits in terms of faster write time and improved position-related accuracy of the features being exposed by the beam.

An undesirable effect called edge blur is caused by such gray scale writing techniques. This refers to blurring of the edges of features as exposed. This effect has been minimized in the past by using high contrast resist as the sensitive (resist) layer and a dry etch process for subsequent processing steps. However, there still remain the problems of corner rounding, line end shortening and line edge roughening. Corner rounding refers to features, which typically are intended to be square or rectangular, having their nominally right angle corners rounded off after the substrate is exposed and processed. Line and shortening refers to lines that are not imaged at their normal length. Line edge roughening refers to slanted feature edges, which are lines lying at an angle to the X-Y grid defined by the pixels, not being imaged exactly in their nominal position.

There is a need for sharper corners and more precisely defined lines, especially when making masks. Masks need to be extremely precise because they are later used for producing, using optical stepper lithography, semiconductor integrated circuits. Current technology does not address the corner rounding or line end shortening problems.

SUMMARY

This disclosure is directed to a raster scanning method and associated apparatus using multiple pass writing to expose a particular pattern whereby the raster scan is repeated several times. This by itself is well known. Additionally, in accordance with this disclosure, the shape (cross section) of the exposing beam is varied. Certain of the passes are performed using a conventional round Gaussian (diffused) beam. Others of the passes are performed using a shaped beam; each pass images particular pixels. In any one pass, only the shaped beam or Gaussian beam is used. The beam spot size, shape and dose can be changed in each pass. The choice of beam parameters is predetermined and is related to the number of passes and other conventional lithography parameters. This process has been found to improve sharpness of corners, to reduce line end shortening and to improve line edge roughness. Typically the bulk of the feature (most of the non-zero pixels) is exposed using the Gaussian beam. Follow up passes are performed using a shaped beam, especially at the corners and slanted lines. This process can be done without substantially degrading throughput compared to using only a Gaussian beam. For the slanted edges and corners, a higher proportion of the pixels are imaged using the shaped beam versus the Gaussian beam.

Further, one can take advantage of per pixel deflection where particular pixels are scanned having a deflection having other than their nominal deflection in order to improve the imaging of feature serifs using the shaped beam. A serif is a particularly shaped extension attached to a larger feature. Serifs are typically rectangular in shape, and have a size that is smaller than the larger feature. Serifs are used to improve image fidelity on masks after processing and can be used to improve lithography on the semiconductor wafer. Per pixel deflection refers to a known raster scan lithography technique for defining an edge of a feature to lie between pixel centers, i.e., to move the edge of a feature off the nominal pixel grid. This is done directly during pixel writing by deflecting the beam so that the pixel centers are displaced by a variable preselected amount from the normal pixel grid center positions. Such per pixel deflection is typically limited to less than plus or minus one half of an address unit.

Thus, a combination of Gaussian and shaped beams is used for various passes to expose a particular pattern. This process is applicable to both laser beam scanning lithography and charged particle (for instance, electron beam) raster scanning lithography. The corresponding apparatus is essentially a conventional laser or electron beam scanning lithography tool, modified by having a beam shaping element (of the type known in the art) and also of course suitable modifications to the data path and/or data handling software to partition the pixels into those to be exposed by the Gaussian beam versus the shaped beam. The relevant distinction here is that the Gaussian beam typically does show some appreciable intensity peak at its center; whereas the shaped beam is of a more uniform intensity over its entire cross section.

A shaped beam typically is capable of exposing multiple pixel sites simultaneously, instead of the single pixel site exposed one at a time in conventional raster scanning. Hence when a variable shape beam is used, the data must additionally include the location, size and shape for each flash. Hence, the distinguishing characteristics of shaped beams versus Gaussian beams include exposing multiple pixel sites in a single flash using the shape beam. The shaped beams are typically considered somewhat slower than conventional raster scanning. This is partly due to delays in the shaped beam in settling of the electronic beam shaping components which are capable of shaping the beam over a wide range of dimensions. Shaped beams generated by laser systems can also suffer from similar speed constraints. Also, current density is generally lower in the shaped beam approach due to the need for the shaped beam to be capable of covering larger areas simultaneously, again leading to lower throughput.

By "shaped" it is meant not just fixed in shape but more inclusively having a variably adjustable shape. This is unlike the case with a Gaussian shape beam which has the typical round shape with only variably adjustable width.

DETAILED DESCRIPTION

In accordance with this disclosure, an otherwise conventional raster scanning lithography tool is modified, in the data path of data processing, and in the beam forming components so that it is capable of writing with a shaped beam so as to reduce corner rounding (provide sharper corners) without sacrificing throughput or accuracy. This modified tool is also capable, of course, to improve writing of slanted feature edges and lines. The above described associated problem of edge blur is a function of spot size, shape, current distribution within the beam (for electron and ion beams), dose or gray levels, and resist contrast. A reduction of edge blur of course provides an exposure which is closer to that of a nominal (design) feature.

In accordance with this disclosure, a feature is written on a substrate using a mostly conventional raster scan lithography tool having the capability of variably shaping the cross-section of the beam. A particular feature is written using several passes; multi-pass lithography is well known in the raster scanning field. Data sampling is used to expose a fraction of non-zero (exposed) pixels in each pass. The spot size, shape, and dose are changed from pass to pass. Moreover, certain of the passes are exposed using a shaped beam, and other of the passes are exposed using a non-shaped (Gaussian) beam. Typically, most of the pixels are exposed using the Gaussian beam while only certain of the pixels, for instance, at feature corners and at slanted edges, are exposed using the shaped beam. However, it is to be understood in this embodiment that in any one pass, the shape of the beam is constant. That is, the beam is reshaped only between passes. (Variably shaping a beam during a pass would undesirably reduce throughput).

Figure 1A:
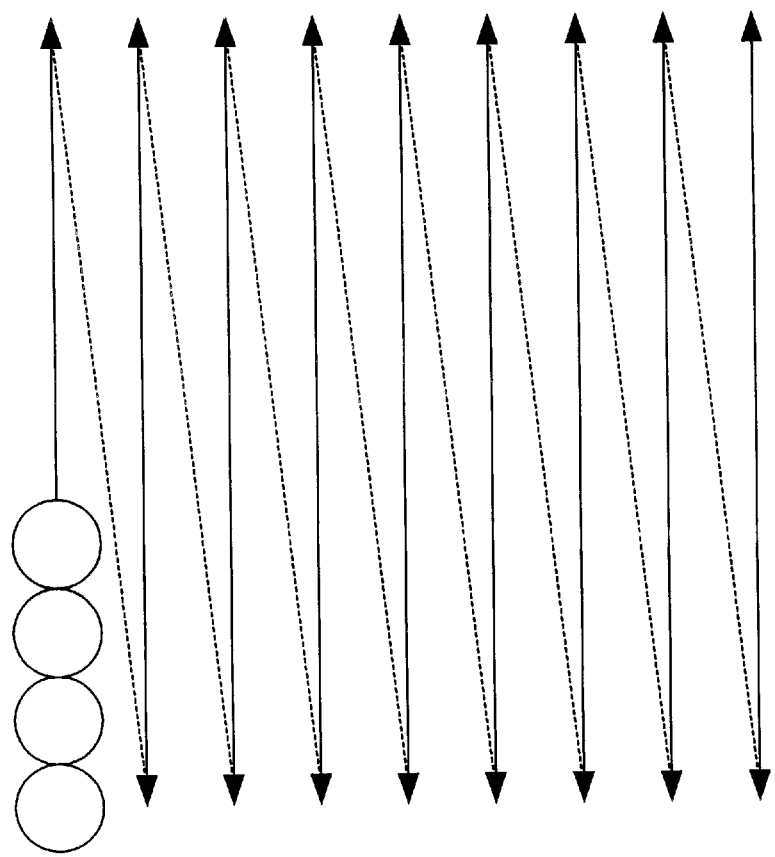
FIGS. 1a, 1b show, respectively, raster scanning with a Gaussian beam and a shaped beam.
Figure 1B:
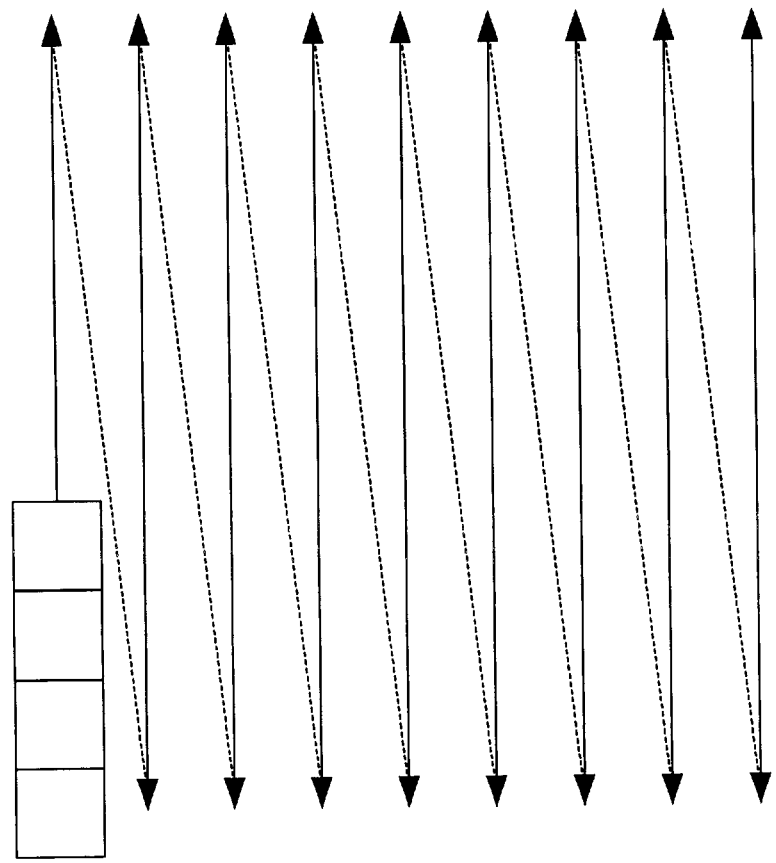

Thus, in one embodiment, multi-pass writing is used with a Gaussian beam for the bulk of the pattern and then one improves the sharpness of the corners and the definition of the slanted edges (relative to the writing grid) with touch-up passes with the shaped beam. There may be only one such touch-up pass or several, depending on the pattern and other relevant parameters, as is understood by one of ordinary skill in the art. The selection of which pixels are exposed using the shaped beam is of course pattern dependent. Typically there must be adequate intelligence in the data path of the lithography tool to determine which portions of the pattern are subject to edge blur and to expose those portions using the shaped beam. This pixel partitioning is performed in the data path by suitable circuitry or alternatively off-line by software. The partitioning is relatively simple, of course, since the patterns are defined by numerical coordinates, so to determine the location of corners and slanted edges is, in principle, easy. The number of passes can be changed. FIG. 1a shows diagrammatically raster scanning with a Gaussian (circular) beam. The beam diameter is variable from pass to pass. FIG. 1b shows diagrammatically raster scanning with a shaped (here, rectangular) beam. The shape is variable from pass to pass.

Further, the additional feature of individual pixel deflection as explained above may be used on particular pixels to expose them off the writing grid. This per pixel deflection may also be used with the shaped beam to form serifs in the shape of the shaped beam. These serifs can be incorporated into existing passes or written (exposed) as a separate, distinct pass.

Figure 2:
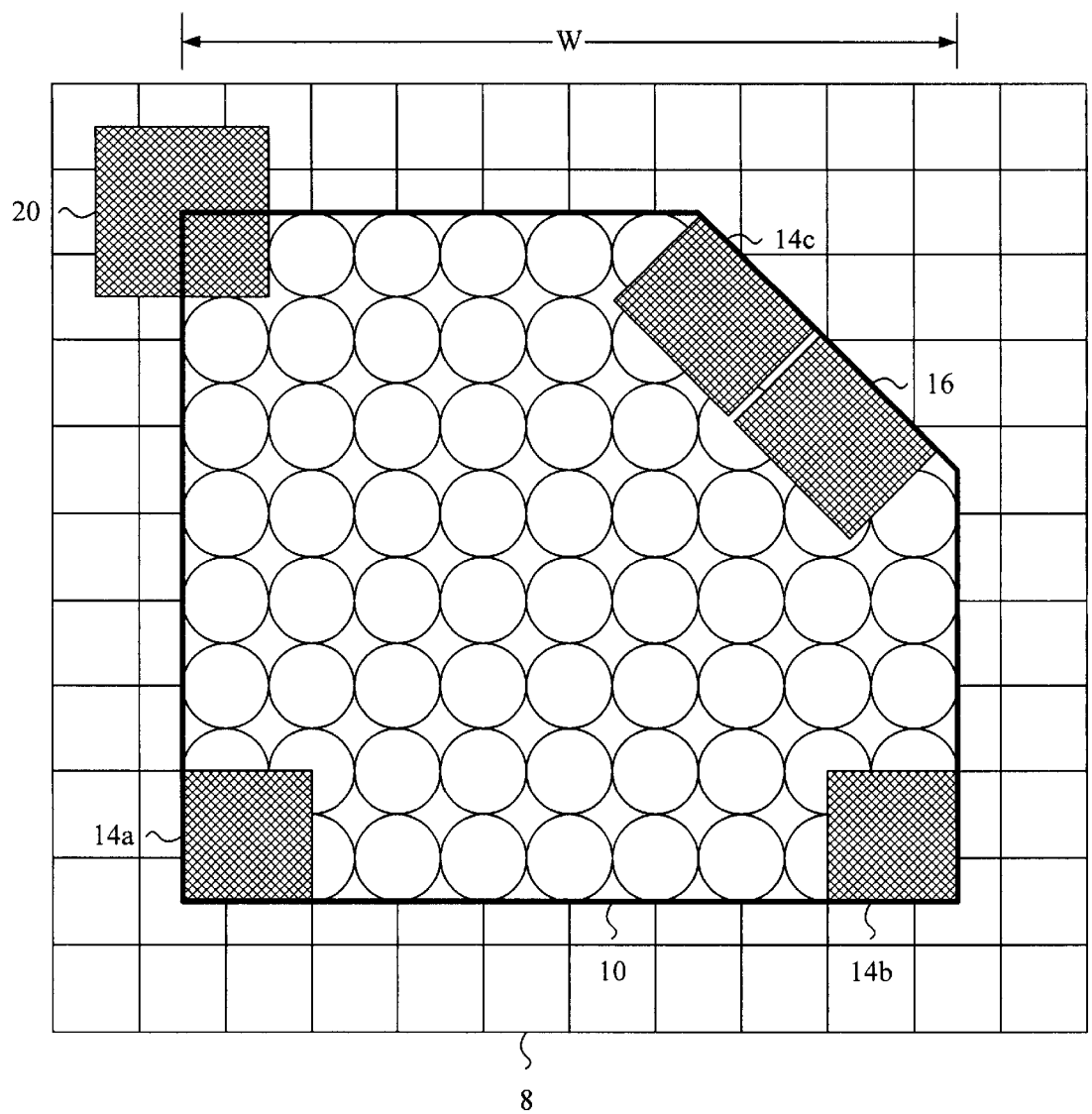
FIG. 2 shows diagrammatically a raster scanning method in accordance with this disclosure.

FIG. 2 shows diagrammatically an exposure method in accordance with this disclosure. This is a plan view of a small part of a substrate 8, for instance a semiconductor wafer or mask blank, carrying a layer of resist which is being exposed in a beam scanning lithography tool of the type described above. FIG. 2 shows a portion of a feature 10 having as its edge the dark line 16. This dark line 16 is the perimeter of the intended (designed) feature 10. FIG. 2 also shows the grid of vertical and horizontal lines which are the writing grid (it is to be understood that these lines are not an actual physical feature but merely illustrate the sites at which the pixels are imaged.) Note that in practice the exposure spots (circles) can have any diameter and can overlap. That is, there is one pixel at each grid line interception. Of course FIG. 2 is not drawn to scale and is a much enlarged version of the actual physical feature 10 which might have a width W of only a 0.5 $\mu$m or less.

Feature 10 includes several corners 14a, 14b, 14c, as well as a slanted edge 16; the slanted edge 16 is at an angle to the grid lines. Note that the other edges of feature 10 are parallel to the grid lines. The above described edge blur problem in the prior art typically occurs at the corners 14a, 14b, 14c and at slanted edge 16. FIG. 2 shows the feature after it has been exposed. As can be seen, most of the pixels were exposed in one or more raster scan passes using a Gaussian (round) beam to expose pixels. Others of the pixels, at the corners 14a, 14b, 14c and along the slanted edge 16, are imaged in separate raster scan passes using a shaped beam, in this case square and rectangular shaped beams shown in cross hatching. Additionally, one pixel was imaged using an enlarged (square) shaped beam in a separate pass to define the serif 20 extending outside the main feature.

It is to be understood that FIG. 2 shows the pixels as exposed, not developed; the development typically results in the imaging of the entire feature so the individual pixels, after development, are typically not observable. Note of course that the "zero" pixels lying outside feature 10 are not exposed as is conventional; the exposed pixels are thus the non-zero pixels. Zero or non-zero refers to the amount of dose (exposure) applied to any particular pixel. Note that as described above, for any one particular raster scan pass, the beam cross-sectional shape is fixed. That is, a pass uses one of either a Gaussian shaped beam, a square shaped beam, or an elongated rectangular beam, or whatever other shape is desired. This improves throughput and so there is no need, unlike the situation with the usual variable beam shaping, to adjust beam shape on the fly during a particular pass. The present method hence differs from the prior art use of variably shaped beams where the beam shape can be altered from pixel to pixel in any one pass.

Also as shown in FIG. 2, only a portion of the pixels are exposed in any one pass in the present method. Not only is the beam shape changeable, also the size and dose may be changed from one pass to the next. Of course, the dose may also be altered pixel to pixel as is conventional for gray scale exposure techniques. The present method also employs a multipass gray level procedure, whereby exposure levels are created at the substrate by overlying several passes of the beam.

Figure 3:
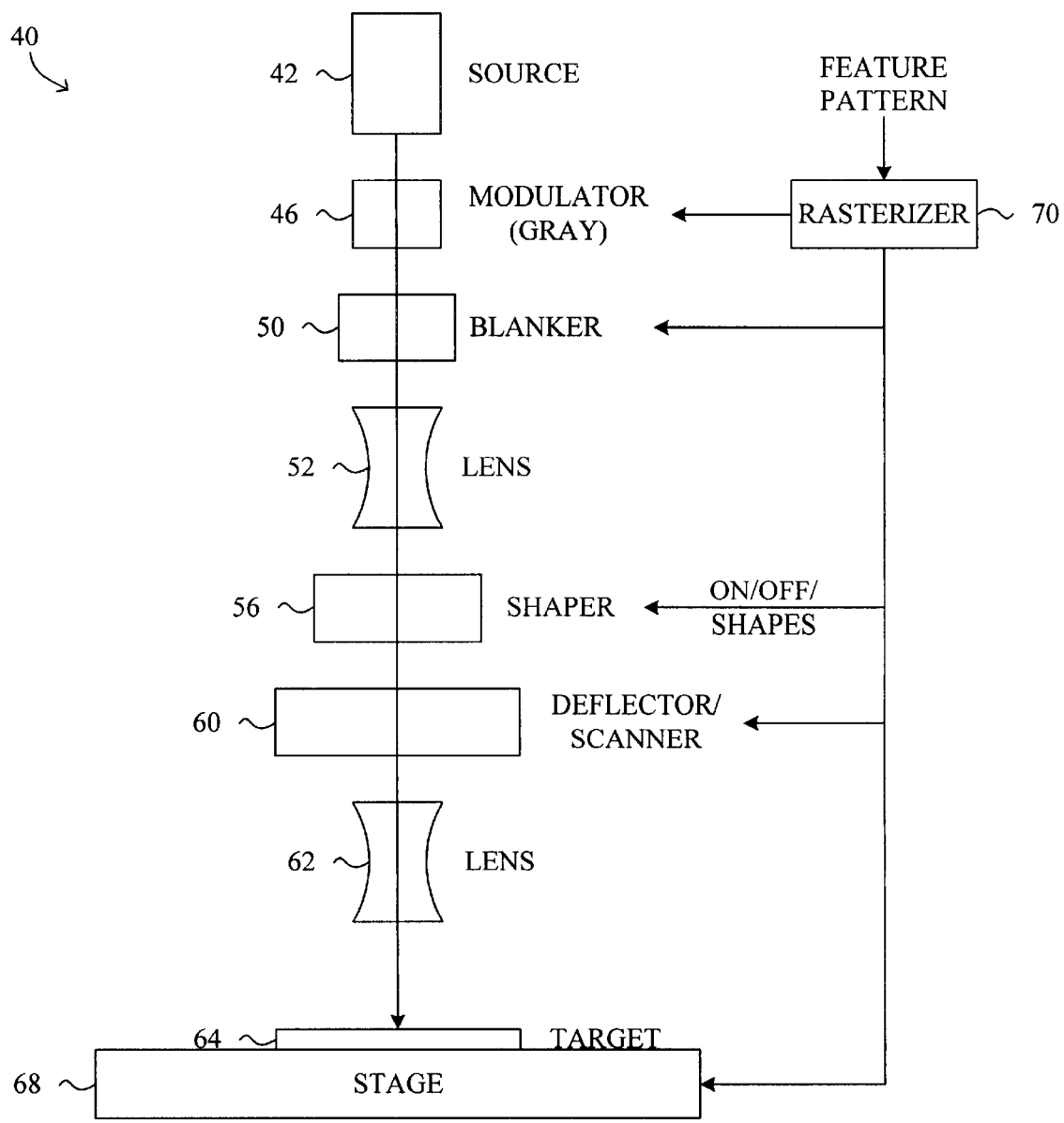
FIG. 3 shows a raster scanning tool in accordance with this disclosure for carrying out the method of FIG. 2.

The FIG. 2 method is carried out, in one embodiment, by an apparatus 40 shown in block diagram form in FIG. 3. FIG. 3 only shows relevant elements and does not show supporting structures, electrical interconnections, or housings. FIG. 3 is generic to either a laser beam scanning tool or an electron beam (charged particle) beam scanning tool. Of course, the particular arrangement of elements shown in FIG. 3 is not limiting but is only illustrative. FIG. 3 shows a beam source 42 typically a laser or an electron beam gun, with the attendant conventional components such as power supplies, accelerators for the electron beam, etc. not shown.

The laser beam or electron beam emitted from source 42 is then modulated by a modulator 46 where gray scale exposure is used. Next, downstream is the blanker 50 which turns the beam for a particular pixel on or off. In one embodiment the modulator 46 and blanker are combined. Modulation is achieved, for example, by changing the duration of blanking for each pixel. Downstream of this is a lens 52. The lens 52 is either an electron lens (an electrostatic or magnetic device) for a charged particle beam or a set of optical lenses in the case of the laser beam tool. Downstream of lens 52 is the beam shaper 56. Beam shapers for laser beams are well known and typically consist of optical elements including apertures and deflectors. Electron beam shapers are well-known as referred to in the above-mentioned patent document. The beam shaper 56 is controlled both in terms of being on or off and also for providing variable shapes. When the shaper 56 is off, the beam, after passing through the shaper 56, is a Gaussian beam; if the shaper 56 is on, the beam assumes any one of a number of cross-sectional shapes such as square, rectangle, semi-circle, etc.

Downstream of the beam shaper 56 is the deflector or scanner 60. In the electron beam situation this is typically a set of deflector electrodes or magnetic coils. In a laser beam scanning machine, also referred to as a pattern generator, the scanner 60 is typically an optical system including a high speed rotating polygon having reflective edge surfaces which mechanically scans the beam across the target substrate.

As shown in FIG. 3, the beam is incident upon the target substrate 64, typically the semiconductor wafer or mask blank carrying a resist layer, which rides on a moveable X-Y stage 68. Another lens 62 is typically located downstream of the deflector/scanner 60 to focus the beam onto the target 64. The controls for various elements including the modulator 46, blanker 50, and shaper 56 are shown as being coupled to the rasterizer or pattern generator 70. This is the electronics portion of the machine which typically includes circuitry and also a programmable computer or processor and to which is input the nominal (design) pattern data. The rasterizer also controls movement of the stage 68 to coordinate it with the beam scanning.

The elements of the FIG. 3 tool, with the exception of the particular functions carried out by the rasterizer 70, are the same as in the prior art. The method illustrated in FIG. 2 is carried out by the rasterizer 70 which includes the data path electronics (circuitry) as well as the computer or processor controlling the lithography tool of FIG. 3. The particular modifications to a conventional rasterizer to carry out the method shown in FIG. 2, will be apparent to one skilled in the art in light of this disclosure and include modifications to both the data path circuitry and the software.

This disclosure is illustrative and not limiting. Further modifications will be apparent to one skilled in the art in light of this disclosure and are intended to fall within the scope of the appended claims.

We claim:

1. A method of forming a pattern on a sensitive medium, comprising the acts of:

generating an energy beam to which the medium is sensitive;

shaping a cross section of the beam;

raster scanning the shaped beam across the medium so as to expose a first portion of pixels defining the pattern, thereby defining a first scanning pass; and raster scanning the generated beam across the medium so as to expose a second portion of the pixels defining the pattern, thereby defining a second scanning pass, wherein the generated beam for the second scanning pass is a Gaussian beam.

2. The method of claim 1, wherein the second pass precedes the first pass.

3. The method of claim 1, wherein the beam is one of a laser beam or a charged particle beam.

4. The method of claim 1, wherein the beam is shaped to have a rectangular cross section.

5. The method of claim 1, wherein the beam is shaped to have a constant intensity over its cross sectional extent.

6. The method of claim 1, wherein the pattern includes a plurality of features, and shaped pixels are exposed at corners of the features.

7. The method of claim 1, wherein the raster scanning defines a grid of perpendicular axes on the medium, and wherein the pattern includes features having edges lying at an angle to the axes, wherein shaped pixels are exposed along the edges and lie at an angle to the grid.

8. The method of claim 1, wherein the acts of raster scanning include applying a preselected deflection to the beam at each pixel defining the pattern.

9. The method of claim 1, wherein the pattern includes a serif extending from an edge of a feature, and comprising the act of exposing the serif with a shaped beam in at least one scan.

10. The method of claim 1, further comprising the act of modulating the beam intensity.

11. The method of claim 1, further comprising the act of modulating the exposure by raster scanning a plurality of passes of round and shaped beams.

12. The method of claim 1, further comprising the act of reducing image error by offsetting the origin of each scanning pass.

13. The method of claim 1, further comprising the acts of making additional scanning passes of the generated beam and wherein in each pass shaping of the beam is to a lesser extent than in a previous pass.

14. A lithography apparatus, comprising:

a source of an energy beam;

a support for a medium sensitive to the beam, and onto which the beam is incident;

a scanner located to scan the beam in a raster pattern across the medium;

a beam shaper element located intermediate the support and the source, thereby to shape a cross section of the beam; and a control coupled to a control terminal of the beam shaper element to selectively activate the beam shaper element for each raster scan pass, whereby a first raster scan pass exposes a first portion of pixels defining the pattern with the beam shaper element activated to generate a shaped beam, and a second raster scan pass exposes a second portion of the pixels defining the pattern with the beam shaper element not activated to generate a Guassian beam.

15. The apparatus of claim 14, wherein the second pass precedes the first pass.

16. The apparatus of claim 14, wherein the beam is one of a laser beam or a charged particle beam.

17. The apparatus of claim 14, wherein the beam is shaped to have a rectangular cross section.

18. The apparatus of claim 14, wherein the beam is shaped to have a constant intensity over the cross sectional extent.

19. The apparatus of claim 14, wherein the pattern includes a plurality of features, and the first portion of pixels includes those at corners of the features.

20. The apparatus of claim 14, wherein the raster scanning defines a grid of perpendicular axes on the medium, and wherein the pattern includes features having edges lying at an angle to the axes, wherein the first portion of pixels includes more pixels at the edges and lying at an angle than does the second portion of pixels.

21. The apparatus of claim 14, wherein the raster scanning includes applying a preselected deflection to the beam at each pixel defining the pattern.

22. The apparatus of claim 14, wherein the pattern includes a serif extending from an edge of a feature, and the serif is exposed by a third pass.

23. The apparatus of claim 14, wherein control modulates the exposure by raster scanning a plurality of passes of round and shaped beams.

24. The apparatus of claim 14, wherein the control reduces image error by offsetting the origin of each scanning pass.

25. The apparatus of claim 14, wherein the control makes additional scanning passes of the generated beam and wherein in each pass shaping of the beam is to a lesser extent than in a previous pass.

* * * * *